(12) United States Patent
Chang

(10) Patent No.: US 7,880,231 B2
(45) Date of Patent: Feb. 1, 2011

(54) INTEGRATION OF A FLOATING BODY MEMORY ON SOI WITH LOGIC TRANSISTORS ON BULK SUBSTRATE

(75) Inventor: Peter L. D. Chang, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 12/586,133

(22) Filed: Sep. 16, 2009

(65) Prior Publication Data

US 2010/0006941 A1    Jan. 14, 2010

(51) Int. Cl.
*H01L 27/01* (2006.01)
(52) U.S. Cl. ............... 257/347; 257/352; 257/507; 257/E21.598; 257/E27.112
(58) Field of Classification Search ........... 257/347, 257/352, 507, E21.598, E27.112
See application file for complete search history.

(56) References Cited

U.S. PATENT DOCUMENTS

| 6,051,462 | A  | * | 4/2000 | Ohno | 438/241 |
| 6,724,046 | B2 | * | 4/2004 | Oyamatsu | 257/347 |
| 7,335,934 | B2 | * | 2/2008 | Fazan | 257/296 |
| 7,425,740 | B2 | * | 9/2008 | Liu et al. | 257/306 |
| 2006/0220097 | A1 | * | 10/2006 | Ogura | 257/315 |

* cited by examiner

*Primary Examiner*—Andy Huynh
(74) *Attorney, Agent, or Firm*—Blakely, Sokoloff, Taylor & Zafman LLP

(57) ABSTRACT

A method and the resultant memory is described for forming an array of floating body memory cells and logic transistors on an SOI substrate. The floating bodies for the cells are formed over the buried oxide, the transistors in the logic section are formed in the bulk silicon.

4 Claims, 6 Drawing Sheets

INTEGRATION OF A FLOATING BODY MEMORY ON SOI WITH LOGIC TRANSISTORS ON BULK SUBSTRATE

REFERENCE TO RELATED APPLICATION

This application claims priority to U.S. application Ser. No. 11/598,980, filed Nov. 13, 2006.

FIELD OF THE INVENTION

This invention relates to the field of integrated circuit memories, particularly those using transistors with floating bodies.

PRIOR ART AND RELATED ART

Most common dynamic random-access memory (DRAM) cells store charge on a capacitor and use a single transistor for accessing the capacitor. More recently, a cell has been proposed which stores charge in a floating body of a transistor. A back gate is biased to retain charge in the floating body.

In one proposal, an oxide layer is formed on a silicon substrate and a silicon layer for the active devices is formed on the oxide layer (SOI substrate). The floating bodies are defined from the silicon layer; the substrate is used as a back or biased gate. One problem with this arrangement is the relatively high voltage required on the back gate because of the thick oxide. One such structure is discussed in connection with FIG. 1.

Several structures have been proposed to reduce the relatively high bias potential discussed above, including use of a planar double gate floating body and silicon pillars. These structures are difficult to fabricate. This and other related technology is described at C. Kuo, *IEDM*, December 2002, following M. Chan Electron Device Letters, January 1994; C. Kuo, *IEDM*, December 2002, "A Hypothetical Construction of the Double Gate Floating Body Cell;" T. Ohsawa, et al., *IEEE Journal of Solid-State Circuits*, Vol. 37, No. 11, November 2002; and David M. Fried, et al., "Improved Independent Gate N type FinFET Fabrication and Characterization," *IEEE Electron Device Letters*, Vol. 24, No. 9, September 2003; Highly Scalable FBC with 25 nm BOX Structure for Embedded DRAM Applications, T. Shino, *IDEM* 2004, pgs 265-268; T. Shino, *IEDM* 2004, "Fully-Depleted FBC (Floating Body Cell) with enlarged signal Window and excellent Logic Process Compatibility;" T. Tanaka, *IEDM* 2004, "Scalability Study on a Capacitorless 1T-DRAM: From Single-gate PD-SOI to Double-gate FinDRAM; U.S. Patent Application 2005/0224878; and "Independently Controlled, Double Gate Nanowire Memory Cell with Self-Aligned Contacts," U.S. Pat. No. 7,498,211.

Another floating body memory formed on a bulk substrate is described in *Symposium on VLSI Technology Digest of Technical Papers*, page 38, 2005 by R. Ranica, et al. The floating p well, as described, is isolated from neighboring devices by a shallow trench isolation region and underlying n well.

BRIEF DESCRIPTION OF THE DRAWINGS

FIG. 6 is taken generally through the section line 6-6 of FIG. 10.

DETAILED DESCRIPTION

In the following description, a memory and method for fabricating the memory is described. Numerous specific details are set forth, such as specific conductivity types, to provide a thorough understanding of the present invention. It will be apparent to one skilled in the art, that the present invention may be practiced without these specific details. In other instances, well known processing steps and circuits have not been described in detail, in order not to unnecessarily obscure the present invention.

Below, reference is made to a silicon-oxide-insulator (SOI) substrate. SOI substrates are well-known in the semiconductor industry. By way of example, they are fabricated by bonding a monocrystalline silicon layer onto a bulk silicon substrate and then planarizing the silicon layer so that it is relatively thin. This relatively thin, low body effect SOI layer is used for active devices. Other techniques are known for forming an SOI substrate including, for instance, implanting oxygen into a silicon substrate to form a buried oxide layer. The typical SOI substrate includes a bulk monocrystalline silicon substrate which is relatively thick, a buried oxide (BOX) layer disposed on the bulk silicon, and the SOI layer, a relatively thin monocrystalline silicon layer for active devices.

Figure 1:
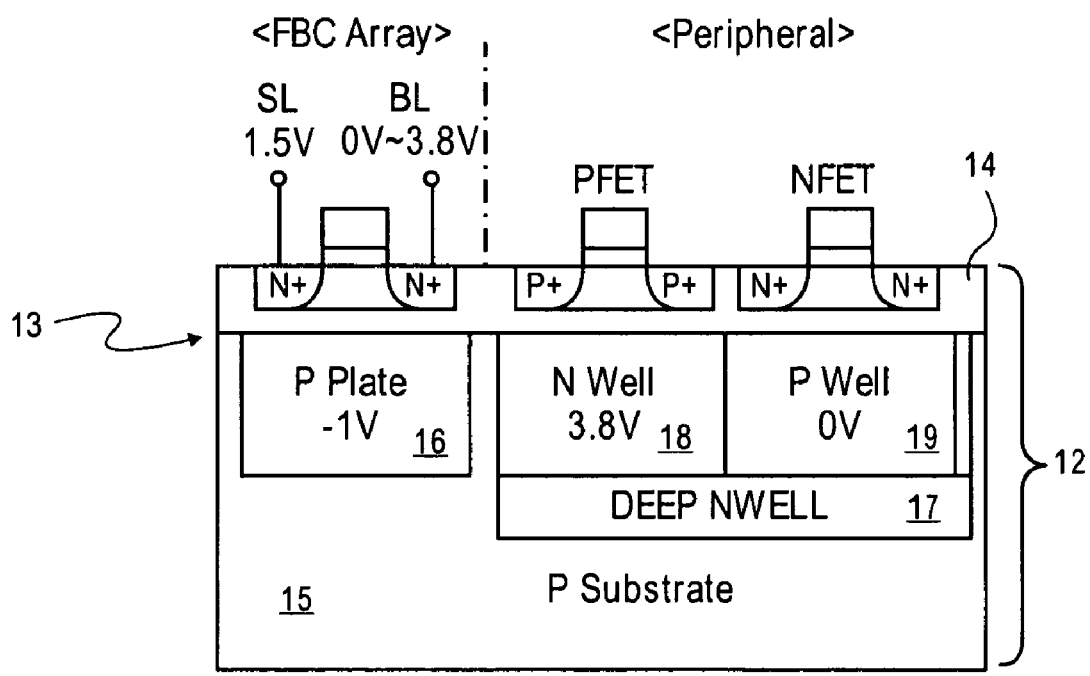
FIG. 1 is a cross-sectional, elevation view of a prior art floating body memory fabricated on a silicon-on-insulator (SOI) substrate.

Prior Art Device of FIG. 1

In FIG. 1, a portion of an integrated circuit, such as a memory array with peripheral logic circuits, is illustrated disposed on an SOI substrate 12. The active devices are formed on the SOI layer 14 which is separated from the bulk silicon substrate 15 by the BOX layer 13.

Several wells are formed in the bulk substrate 15 which are biased appropriately to serve the device formed above the wells. Often, the bulk substrate is a p type substrate such as substrate 15 of FIG. 1. A p well, sometimes referred to as a "plate" 16, is formed in the bulk substrate and negatively biased to act as the back gate or back plate for floating body memory cells (FBCs). The bias on the plate 16 attracts holes in the FBCs, providing a capacitor-like storage for the DRAM cells fabricated in the FBC array.

In the peripheral section of the integrated circuit, n wells such as n well 18, and p wells such as p well 19, are implanted, and isolated from the bulk substrate by a deep n well 17. The n well 18 has p channel transistors fabricated above it in the SOI layer, with the well typically biased at the VCC potential (e.g. 3.8 volts). The p well 19, which is maintained at 0 volts, has n channel devices fabricated above it in the SOI layer.

One problem with the memory of FIG. 1 is that both the FBC array and logic devices are fabricated on the SOI substrate. Consequently, the FBC and logic devices will have the same BOX. Substrates with thinner BOX offer better charge retention for FBC due to stronger capacitive coupling between the substrate and the floating body. The same capacitive coupling, however, can cause high capacitance for logic devices, which may degrade logic device performance for sufficiently thin BOX. Some processes are better suited for fabricating logic devices on a bulk substrate so that the logic devices may be optimized for specific applications such as high speed circuits and SRAM. In addition, circuit design methodology developed for bulk devices may be utilized while capturing the benefit of FBC devices on SOI. As will be seen below, the present invention provides a solution to this problem.

Overview of Two Embodiments

Figure 2:
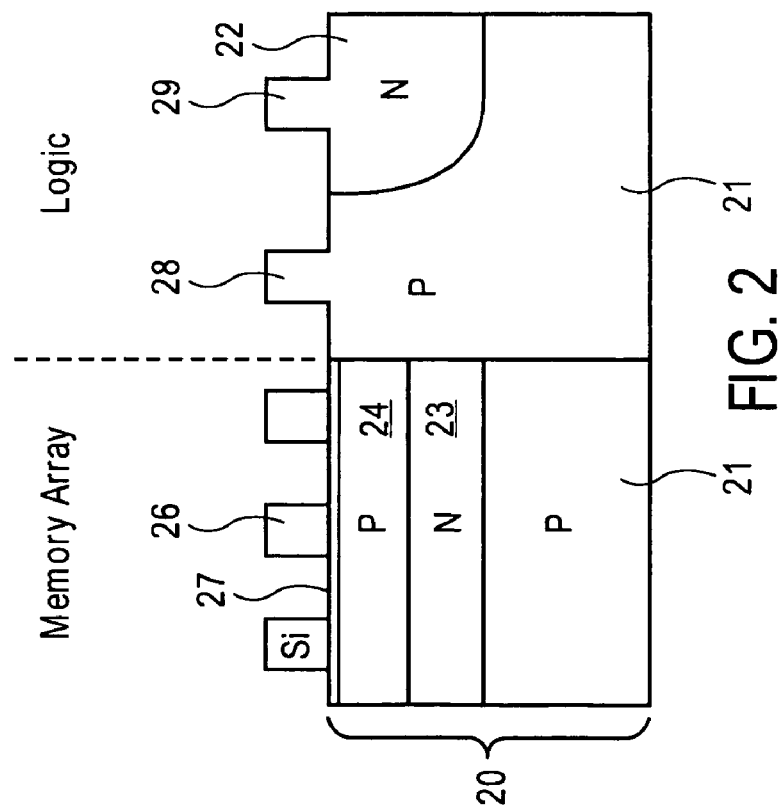
FIG. 2 is a cross-sectional, elevation view of a memory fabricated in accordance with an embodiment of the present invention.

Referring first to FIG. 2, an SOI substrate 20 is illustrated. The substrate 20 has a p type monocrystalline silicon bulk substrate 21. An integrated circuit, such as a memory having a memory array and peripheral circuits using ordinary CMOS logic, is fabricated on the SOI substrate. However, the SOI layer is removed for the logic devices. In the embodiment of FIG. 2, a deep n well 23 is implanted in the p type bulk substrate and an overlying p well 24 is implanted within the n well 23. These wells are disposed below those sections of the SOI layer where a memory array is fabricated. As illustrated, the BOX layer 27 remains on the p well 24. Diffusion bodies 26 for FBCs are fabricated from the SOI layer.

In the sections of the integrated circuit where the logic devices are fabricated, the SOI layer and underlying oxide are removed and the bulk substrate is epitaxially grown to a level approximately equal to the level of the SOI layer in the memory section. For the illustrated embodiment, fins 28 are fabricated from the bulk silicon in the p type bulk substrate, for n channel transistors. An n well 22 is implanted in the p type bulk substrate and fins 29 are fabricated in this well for the p channel transistors.

Consequently, the BOX layer 27 may be made relatively thin, and its thickness optimized for the memory array without concern about the capacitive coupling the thin oxide provides in the logic section of the memory or other integrated circuit. By removing the BOX layer 27 in the logic area may provide additional benefits for some circuits, such as 6-transistor SRAM, due to elimination of the floating body.

Figure 3:
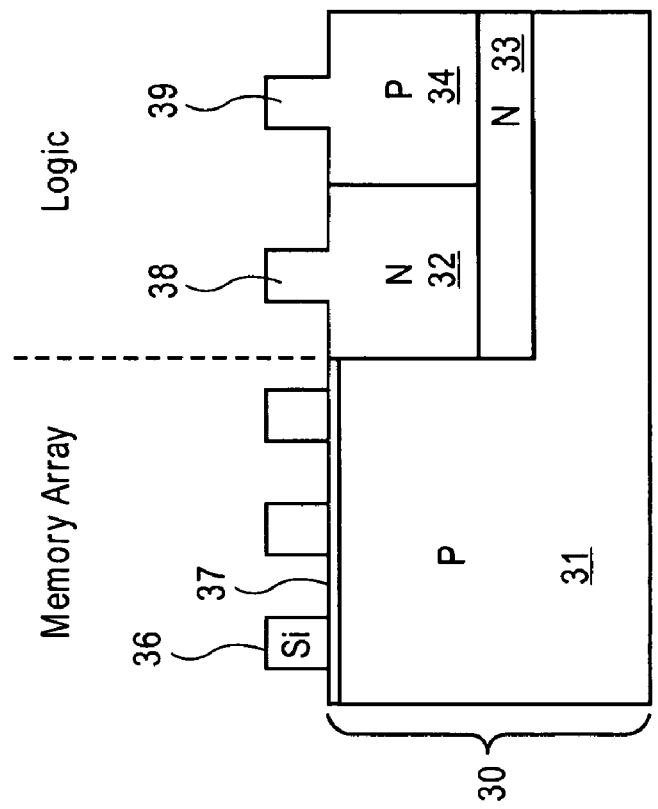
FIG. 3 is an alternate embodiment to the memory illustrated in FIG. 2.

Note that in FIGS. 2 and 3 and the other figures, it is assumed that tri-gate n channel and p channel devices are fabricated in the logic section from the fins. Planar CMOS devices may also be formed in the bulk silicon.

A different embodiment is shown in FIG. 3, where the well arrangement is similar to the well arrangement shown in the prior art memory of FIG. 1. Again, here, a starting p type SOI substrate 30 is used. The bulk substrate 31 is the back gate for the FBCs in the SOI layer. The SOI layer is etched defining the diffusion bodies 36 for the FBCs. A deep n well 33 is implanted in those sections of the bulk substrate where the logic devices are to be fabricated. N wells 32 and p wells 34 are implanted over and within the n well 33. Fins 38 for the p channel devices are etched from the bulk silicon in the wells 32, and similarly, fins 39 are etched in the bulk silicon of the p wells 34 for the n channel devices.

The wells in the bulk silicon for FIGS. 2 and 3 may be formed using ion implantation as is well-known in the art. The wells can be formed as an initial step in the processing before any fabrication occurs for the logic or memory devices. Alternatively, the wells can be formed at a later stage in the processing, for instance, after the bodies and fins have been formed, or for that matter, at other points in the processing.

Processing of FIGS. 4-7

Figure 4:
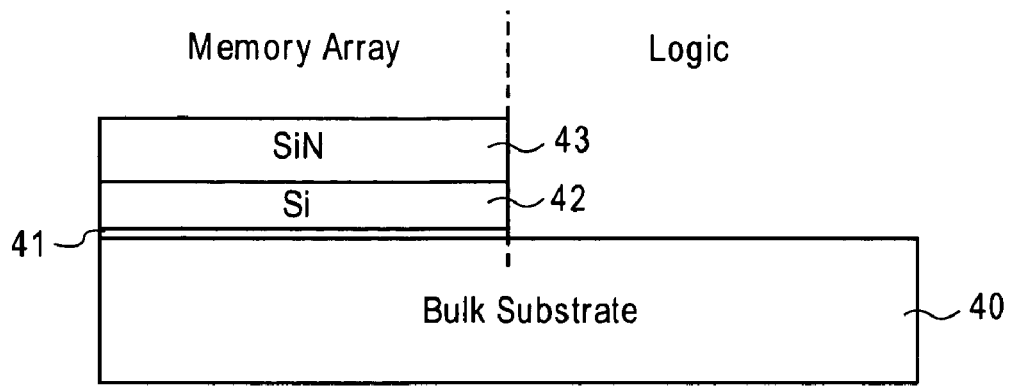
FIG. 4 is a cross-sectional, elevation view of a SOI substrate, after removal of an overlying silicon and underlying insulator on the sections of the substrate used for logic devices in an integrated circuit memory.

Referring to FIG. 4, an SOI substrate is used as a starting wafer for one embodiment. It includes the bulk monocrystalline silicon substrate 40, typically doped with a p type dopant, a BOX layer 41, and an overlying monocrystalline silicon (SOI) layer 42. A pad oxide is first grown or deposited on the silicon layer 42 (not shown). Then, a silicon nitride layer 43 is deposited over the pad oxide, and masked and etched to protect those sections of the substrate where the memory array is to be fabricated. After removing the exposed pad oxide, the silicon of the SOI layer can be dry or wet etched to stop at the underlying BOX layer 41. A wet or dry etchant can be used to remove the BOX 41 where exposed, revealing the underlying bulk substrate 40. As shown in FIG. 4, this leaves the exposed bulk silicon at a well-defined level below the level of the SOI layer.

Figure 5A:
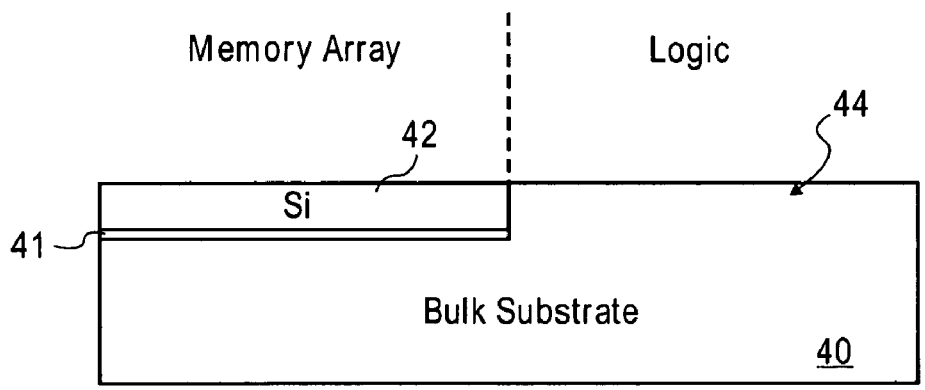
FIG. 5A illustrates the substrate of FIG. 4 after epitaxial growth of silicon.

Now, a selective epitaxial growth of silicon is used to bring the bulk silicon in the logic sections up to the same level as the SOI layer. This is shown in FIG. 5A by the region 44 which has been grown from the bulk substrate 40 to a level approximately equal to the level of the silicon in the memory array. With selective etches for silicon and oxide used for etching the SOI layer 42 and BOX 41, the step height between the top surface of SOI layer 42 and the top surface of bulk substrate 40 is very well controlled. Since the epitaxial growth of silicon also has very good control for film thickness, the top surface of SOI layer 42 and the top surface of expitaxially grown silicon 44 can be well-leveled. A planarization step may not be necessary but may be used to make the two levels more closely matched. The planar structure is desirable for patterning isolations.

Figure 5B:
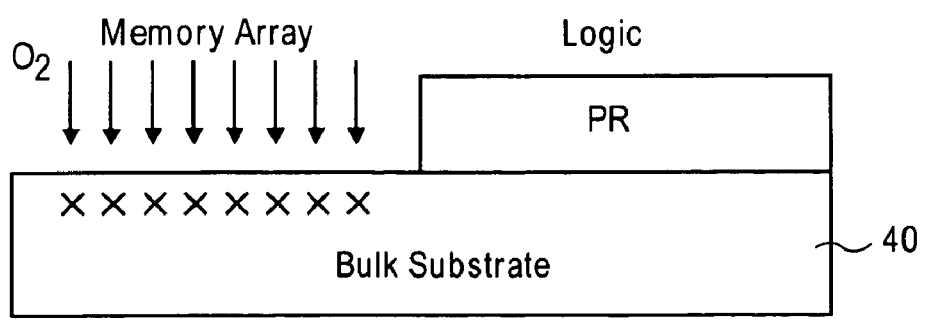
FIG. 5B illustrates an alternate process for providing the structure of FIG. 5A.

The structure of FIG. 5A can be substantially produced with alternate processing shown in FIG. 5B. Here a bulk substrate (not SOI substrate) is used. Those areas where logic devices are to be fabricated are covered with a photoresist or other material that block ions from reaching the underlying substrate. Then the substrate is ion implanted with oxygen at an energy level which implants ions beneath the surface as shown by the "XXX" layer in FIG. 5B. After annealing, the oxygen forms a buried silicon dioxide (BOX) layer in the bulk silicon substrate. This provides a surface layer of monocrystalline silicon isolated from the bulk substrate by a $SiO_2$ layer (SOI layer), substantially as shown in FIG. 5A.

At this point in the processing, or prior to this point or after this point, the wells shown in FIG. 2 or 3 can be formed in the bulk substrate 40.

Now, a pad oxide layer 51 and a silicon nitride layer 50 are formed over the silicon in both the SOI layer and bulk silicon substrate where exposed. The nitride layer is masked and etched to define silicon bodies for the FBCs in the memory section that later will be implanted with source and drain regions, as well as fins for the logic devices in the logic section. The resulting bodies, along with isolation oxide 55, formed in a standard shallow trench isolation process, are shown in FIGS. 6 and 7.

Figure 6:
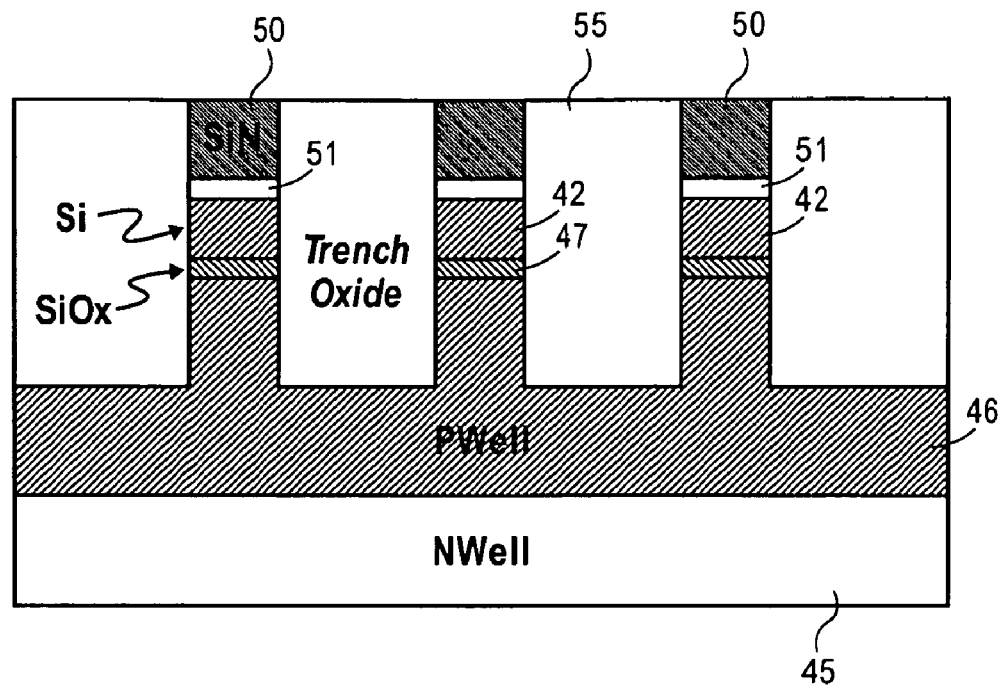
FIG. 6 illustrates the substrate of FIG. 5A following several ion implantation steps, formation of isolation regions, and formation of silicon bodies in the memory section of the integrated circuit.
Figure 7:
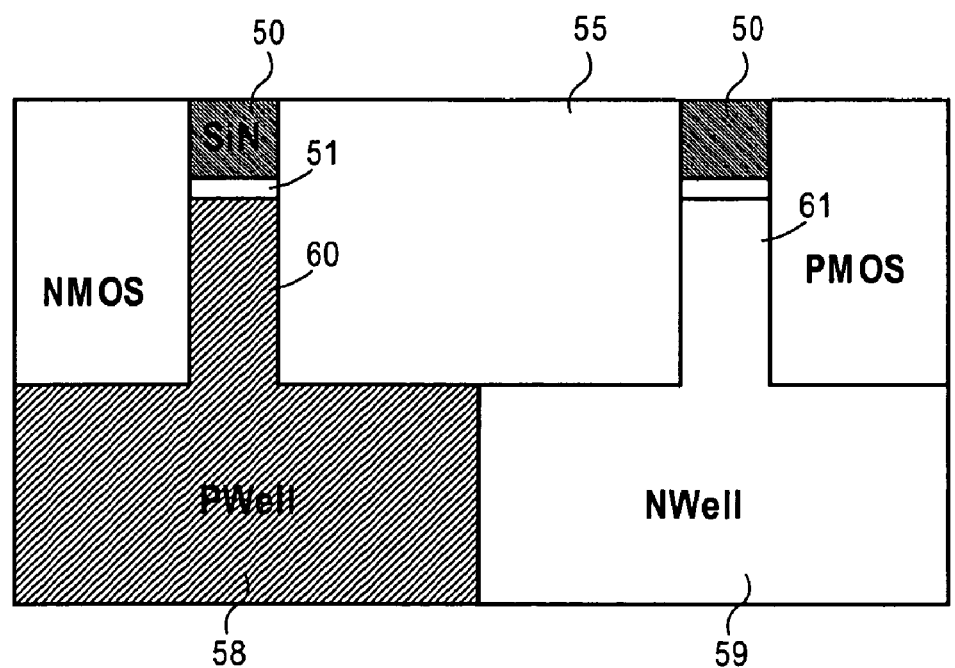
FIG. 7 is a cross-sectional, elevation view corresponding to the point in processing of FIG. 6, however for the logic section of the integrated circuit.

Referring first to FIG. 6, it should be noted that the bodies 42 are isolated by the BOX layer 47 from the underlying substrate. Thus, the bodies 42 are truly floating, and when the p well 46 is biased, charge will accumulate in the channel portion of the FBCs. In FIG. 7 it should be noted that the fin 60 for the NMOS device extends from the p wells 58 and is integral with the silicon in this well. Similarly, the fin 61 for the PMOS device extends from, and is integral, with the n well 59.

Figure 8:
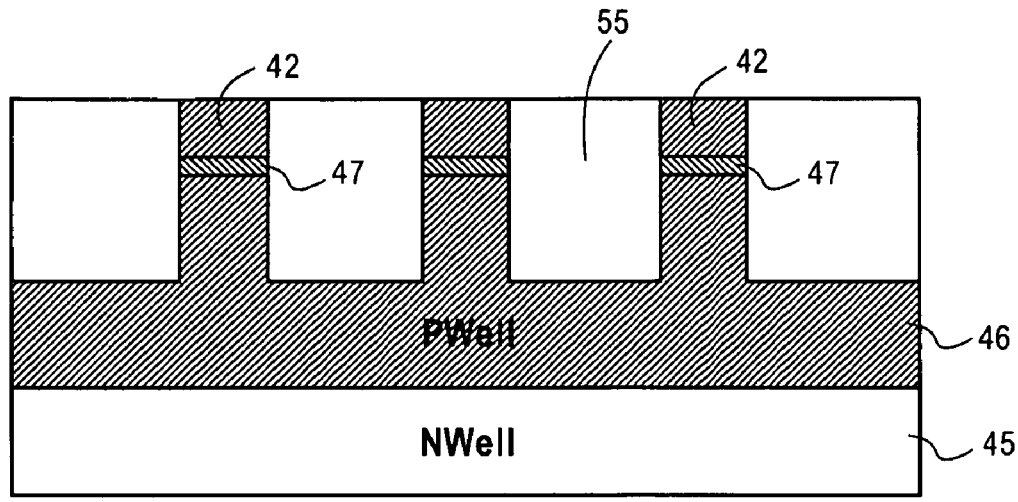
FIG. 8 illustrates the structure of FIG. 6, following additional trench isolation processing.
Figure 9:
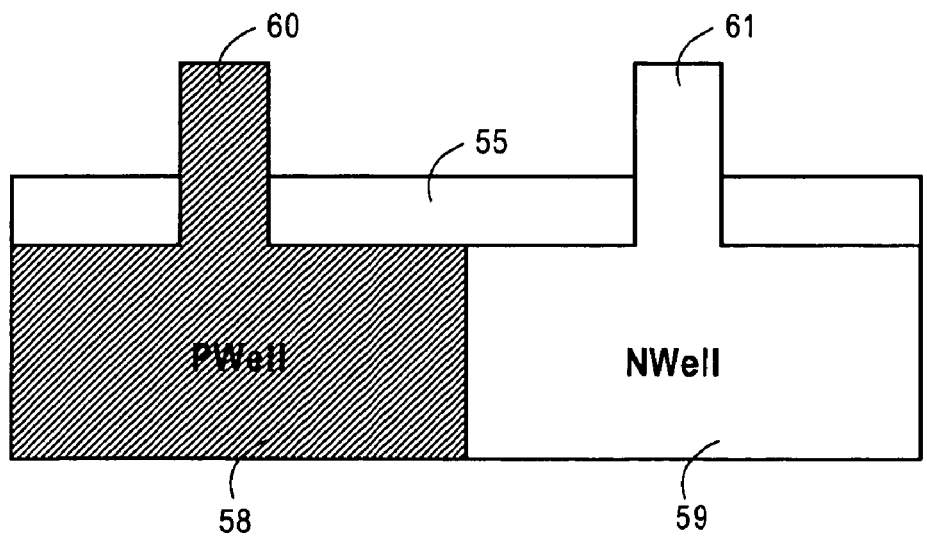
FIG. 9 illustrates the structure of FIG. 7, following additional trench isolation processing.

Next as shown in FIGS. 8 and 9, after the nitride and pad oxide is removed, the trench isolation regions 55 are etched back in the logic section, and for the illustrated embodiment, not initially etched in the memory section. This allows planar devices in the memory area and finFET devices or planar devices in the logic area. Typical FBC devices require thicker gate oxide than the logic devices in the sub-100 nm regime. The thicker gate oxide for FBC devices can be easily formed with typical dual gate oxide process. For example, a thick gate oxide is grown on the wafer. The thick gate oxide is removed in the logic area by masking the FBC area. The wafer is then cleaned and a thin gate oxide is grown across the wafer. The thin gate oxide may contain high k dielectric for the logic devices. Thus, a different dielectric may be used for the front gate of the FBCs.

Following this, a traditional CMOS gate process or a dual metal gate process may be applied to form the transistors. Ordinary tip implants, halo implants, formation of spacers prior to the implantation of the main source and drain regions, can occur. Implant masks may be applied to allow separate implants for the memory and logic areas. Additionally, as is often the case following the deposition of a metal gate, polysilicon may be deposited to permit the subsequent formation of a silicide.

Figure 10:
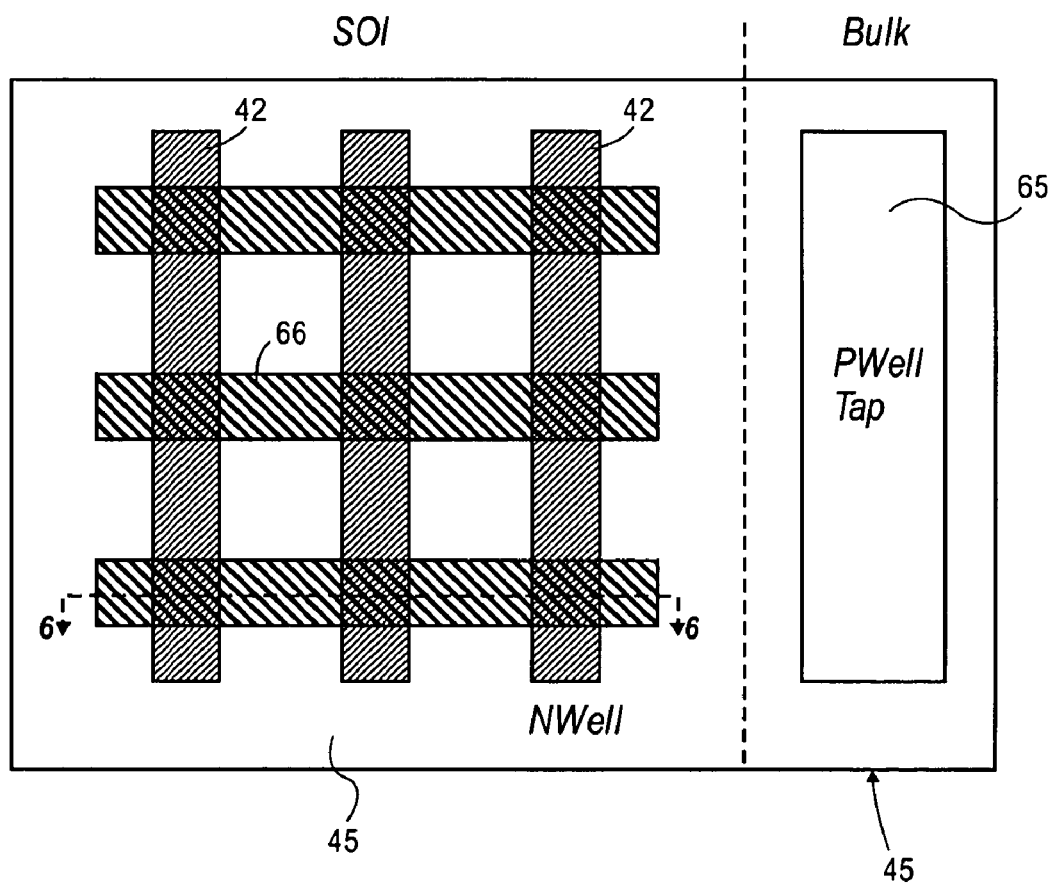
FIG. 10 is a plan view of the integrated circuit memory used to illustrate the memory section of the integrated circuit and the contact for biasing the floating body memory cells.

Referring to the plan view of FIG. 10, the n well 45 previously shown for the memory array is again illustrated. The diffusion bodies 42 are shown along with the completed front gates 66 which act as word lines in a memory. As previously mentioned, the p region underlying the BOX layer for the memory section, is negatively biased. This may be done by providing a p well tap 65 which is most easily fabricated in the bulk silicon. A portion of the p well may be exposed during the step shown in FIG. 4, allowing subsequent access to the p well for the p well tap 65.

Thus, a method of fabricating a memory on an SOI substrate where the logic transistors are formed in a bulk substrate is described.

What is claimed is:

1. An integrated circuit comprising:
   a p-type silicon substrate;
   a memory section having a plurality of monocrystalline silicon bodies disposed on an insulator formed over a first portion of the silicon substrate; and
   a plurality of logic devices formed on a second portion of the silicon substrate comprising a plurality of fins integral with the silicon substrate, the fins having bases at a level approximately equal to the level of the insulator formed over the first portion of the silicon substrate; and
   at least one well disposed in the silicon substrate such that first regions of the silicon substrate below the memory section can be differently biased from second regions of the silicon substrate below the logic devices.

2. The integrated circuit of claim 1, including a tap electrically connected to a p type region disposed beneath the insulator underlying the memory section, for biasing the memory section.

3. The integrated circuit of claim 2, wherein a first plurality of the logic devices are formed in n wells of the silicon substrate and a second plurality of logic devices are formed in p wells of the silicon substrate.

4. The integrated circuit of claim 1, wherein a first plurality of the logic devices are formed in n wells of the silicon substrate and a second plurality of logic devices are formed in p wells of the silicon substrate.

* * * * *